(12) United States Patent
Jankowski et al.

(10) Patent No.: US 10,365,678 B2
(45) Date of Patent: Jul. 30, 2019

(54) MEASURING INTERNAL VOLTAGES OF PACKAGED ELECTRONIC DEVICES

(71) Applicant: TEXAS INSTRUMENTS INCORPORATED, Dallas, TX (US)

(72) Inventors: Maciej Piotr Jankowski, Munich (DE); Peng Cao, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/973,691

(22) Filed: May 8, 2018

(65) Prior Publication Data

US 2019/0121381 A1 Apr. 25, 2019

Related U.S. Application Data

(60) Provisional application No. 62/576,765, filed on Oct. 25, 2017.

(51) Int. Cl.
| | |
|---|---|
| *G05F 1/10* | (2006.01) |
| *G05F 3/16* | (2006.01) |
| *G01R 31/28* | (2006.01) |
| *H03M 3/00* | (2006.01) |

(52) U.S. Cl.
CPC .......... *G05F 3/16* (2013.01); *G01R 31/2884* (2013.01); *G01R 31/2896* (2013.01); *H03M 3/30* (2013.01)

(58) Field of Classification Search
CPC ......... H01L 2924/00; H01L 2924/0002; H01L 2924/1305; H01L 2924/13055
See application file for complete search history.

(56) References Cited

U.S. PATENT DOCUMENTS

2005/0088870 A1\* 4/2005 Kozuka ................ G11C 29/006
365/145

\* cited by examiner

*Primary Examiner* — Sibin Chen
(74) *Attorney, Agent, or Firm* — John R. Pessetto; Charles A. Brill; Frank D. Cimino (57) ABSTRACT

An method comprising activating an internal switch within a packaged electronic device to connect to a reference ground of an internal voltage source to a first input of an analog front end, receiving an external ground potential voltage at a first package pin of the packaged electronic device, generating a zero detector output signal for the packaged electronic device at a second package pin, activating the internal switch to connect the first input of the analog front end to the internal voltage source, receiving a second voltage level at the first package pin that generates a second output signal that matches the zero detector output signal, and receiving trim instructions to trim an internal voltage generated by the internal voltage source to a voltage level that is closer to a target voltage level.

20 Claims, 6 Drawing Sheets

MEASURING INTERNAL VOLTAGES OF PACKAGED ELECTRONIC DEVICES

CROSS-REFERENCE TO RELATED APPLICATIONS

The present application claims priority to U.S. Provisional Patent Application No. 62/576,765, filed Oct. 25, 2017, titled "Method for Measuring Internal Voltages of Integrated Circuits," which is hereby incorporated herein by reference in its entirety.

BACKGROUND

Electronic devices, such as isolated integrated delta-sigma modulators (DSMs) and isolated amplifiers, employ DSMs that rely on internal bandgap voltage references to achieve relatively low temperature variation. For example, a product data sheet for an isolated amplifier may state that an isolated amplifier has a temperature gain drift of about ±15 parts per million per degree Celsius (ppm/° C.). To achieve a relatively low temperature variation, manufactures often trim the electronic device's internal bandgap reference voltages to a designated value. However, errors in the bandgap trimming process could negatively impact the temperature gain drift. For instance, a bandgap trim error of 1 millivolt (mV) could introduce a temperature gain drift of about 2.8 ppm/° C. Therefore, performing inaccurate bandgap trims can negatively impact the amount of temperature variation for electronic devices.

To account for package induced temperature shifts, manufactures generally utilize automatic test equipment (ATE) to measure and adjust internal bandgap reference voltages. One manner to measure the internal bandgap reference voltage for a packaged electronic device (e.g., an isolated amplifier) that has a relatively low package pin count is to connect the internal voltage to a suitable package pin (e.g., voltage input pin). One solution is to power down the analog front end and connect the internal voltages through resistors, Unfortunately, in certain instances, the assigned package pin may have a relatively large series resistance (e.g., greater than 1 Megaohm (MO)) between the assigned package pin and the signal-to-be-measured that causes measurement errors to be prohibitive when some small leakage current is flowing because of limited impedance of the measurement equipment. As an example, analog front ends in a differential amplifier configuration with relatively large bipolar input swings that exceed supply voltages typically need large input resistances to attenuate the input signal. The large input resistances can cause relatively large measurement errors when some small leakage current flows through the packaged electronic device's pin. Hence, being able to accurately measure internal bandgap reference voltages within packaged electronic device remains valuable in performing accurate bandgap trims and minimizing temperature variation for electronic devices.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one implementation, a packaged electronic device comprising: an internal switch and a first package pin, an analog front end coupled to the internal switch and the first package pin, an internal voltage source that is not directly connected to any package pin of the package electronic device, and a second package pin that produces an output signal based on an input voltage of the analog front end, wherein the packaged electronic device is configured to: receive an instruction to activate the internal switch to connect to a reference ground of the internal voltage source to a first input of the analog front end, receive an external ground potential voltage at the first package pin of the packaged electronic device, generate a zero detector output signal for the packaged electronic device at the second package pin, receive a second instruction to activate the internal switch to connect the first input of the analog front end to the internal voltage source, receive a second voltage level at the first package pin that generates a second output signal at the second package pin that matches the zero detector output signal, wherein the second voltage level differs from the external ground potential voltage; and receive trim instructions to trim an internal voltage generated by the internal voltage source to a voltage level that is closer to a target voltage level.

In another implementation, a non-transitory memory on which instructions are stored, comprising instructions that when executed cause a processor to: generate an instruction to send to a packaged electronic device to activate an internal switch to connect a reference ground of an internal voltage source to a first input of an analog front end of the packaged electronic device, supply an external ground potential voltage to a first package pin of the packaged electronic device, measure a zero detector output signal for the packaged electronic device from a second package pin, generate a second instruction to send to the packaged electronic device to activate the internal switch to connect the first input of the analog front end to the internal voltage source, supply a second voltage level to the first package pin that generates a second output signal that matches the zero detector output signal, wherein the second voltage level is differs from the external ground potential voltage, and determine, based on the second voltage level, a trim amount for an internal voltage generated by the internal voltage source to be closer to a target voltage level.

In yet another implementation, a method comprising: receiving an instruction to activate an internal switch within a packaged electronic device to connect to a reference ground of an internal voltage source to a first input of an analog front end, receiving an external ground potential voltage at a first package pin of the packaged electronic device, generating a zero detector output signal for the packaged electronic device at a second package pin, receiving a second instruction to activate the internal switch to connect the first input of the analog front end to the internal voltage source, receiving a second voltage level at the first package pin that generates a second output signal that matches the zero detector output signal, wherein the second voltage level is greater or less than the external ground potential voltage, receiving trim instructions to trim an internal voltage generated by the internal voltage source to a voltage level that is closer to a target voltage level, and trimming the internal voltage based on the trim instructions.

BRIEF DESCRIPTION OF THE DRAWINGS

For a detailed description of various examples, reference will now be made to the accompanying drawings in which.

While certain implementations will be described in connection with the illustrative implementations shown herein, the invention is not limited to those implementations. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

Various example implementations are disclosed herein to measure internal voltages, such as internal bandgap reference voltages, within packaged electronic devices. In one or more implementations, the packaged electronic device includes an internal switch that allows an input of the analog front end to connect to a reference ground of a bandgap reference voltage source or to the bandgap reference voltage source. Initially, the internal switch is set to have the input of the analog front end connect to the bandgap reference voltage source's reference ground while the ATE forces a relatively low input voltage (e.g., 0 volts (V)) at the voltage input package pin of the packaged electronic device. By forcing an external ground potential voltage, the ATE utilizes an analog front end and a DSM of the packaged electronic device as a zero detector. The resulting output signal (e.g., a digital bitstream output or an analog voltage output) is then stored by the ATE as an output signal value $os_{ZERO}$. Afterwards, the internal switch can move to a position that connects the input of the analog front end to the bandgap reference voltage source. The ATE then adjusts the input voltage supplied to the voltage input package pin until the output signal is the same as the stored output signal value $os_{ZERO}$. At this point, the input voltage supplied to the voltage input package pin can be greater or less than then external ground potential voltage and accurately replicates the internal bandgap reference voltage with respect to its reference ground. The ATE then supplies a target bandgap voltage to the voltage input package pin and trims the internal bandgap reference voltage for the bandgap reference voltage source until the output signal equals the stored output signal value $os_{ZERO}$. In one or more implementations, the ATE may skip determining the untrimmed value and directly apply the target bandgap voltage and trim the internal bandgap reference voltage.

Figure 1:
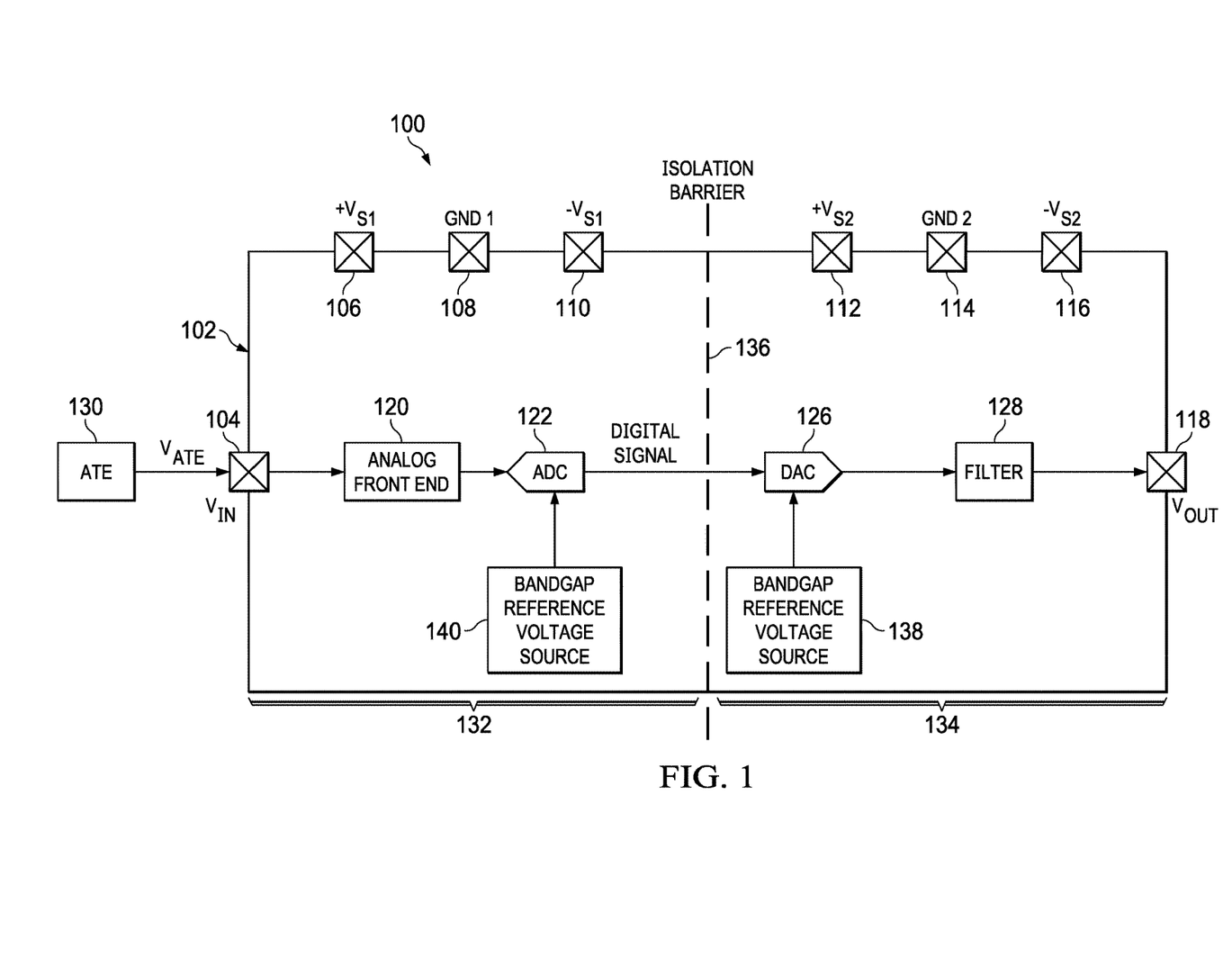
FIG. 1 is a block diagram of a test system in accordance with various implementations.

FIG. 1 is a block diagram of a test system 100 in accordance with various implementations. FIG. 1 illustrates that the test system 100 is able to test and diagnose faults (e.g., measure internal voltages) for packaged electric devices. In particular, the test system 100 includes an ATE 130 and a packaged electronic device 102, where the ATE 130 automatically perform measurements, evaluate test results, and/or diagnose faults for the packaged electronic device 102. Although not explicitly shown in FIG. 1, ones skilled in the art are aware that ATE 130 could include a variety of known components, such as a master controller (e.g., a computer) and a handler. With respect to testing packaged electronic devices, ATE 130 could have the handler place the packaged electronic device 102 on an interface adapter that propagates communication signals (e.g., test signals) between the ATE 130 and the packaged electronic device 102. In one or more implementations, the ATE 130 also includes a socket that connects the packaged electronic device 102 to the interface adapter.

The packaged electronic device 102 includes one or more integrated circuits that are connected together and/or encapsulated in a casing to prevent damage and corrosion. Prior to packaging, manufactures cut the integrated circuits out of wafers and wire bond the integrated circuits to other package components. The packaged electronic device 102 undergoes a packaging process so that the packaged electronic device 102 can connect and/or mount to a circuit board or other medium for connecting a variety of packaged electronic components. The packaging process for forming the packaged electronic device 102 can also generally be referred to within this disclosure as assembly, semiconductor device assembly, encapsulation, and/or sealing.

In FIG. 1, the packaged electronic device 102 is an isolation amplifier that includes an isolation barrier 136 that isolates a first section 132 of the packaged electronic device 102 from a second section 134 of the packaged electronic device 102. The isolation barrier 136 could be implemented using one or more capacitors with relatively small capacitances (e.g., 50 femtofarad (fF)), transformer couplings, or light emitting diode (LED) optocouplers. The first section 132 receives an analog input signal at the $V_{IN}$ package pin 104 and subsequently amplifies and converts the analog input signal to a digital signal. The first section 132 transmits the digital signal across the isolation barrier 136 to the second section 134, where the second section 134 converts the digital signal back to an analog signal. The first section 132 includes +Vs1 package pin 106, Ground 1 package pins 108, and −Vs1 package pin 110 that are separate and independent from the +Vs2 package pin 112, Ground 2 package pin 114, and −Vs2 package pin 116 in the second section 134.

FIG. 1 illustrates that the first section 132 includes an analog front end 120 and an analog-to-digital converter (ADC) 122. The analog front end 120 can be formed from a variety of analog signal conditioning circuitry that receives and amplifies analog signals, such as analog signals from a sensor, and outputs a signal that the ADC 122 is able to process. To condition and amplify analog signals while maintaining an acceptable signal-to-noise ratio (SNR), the analog signal conditioning circuitry could include operational amplifiers (op amps) and/or differential amplifiers. The analog front end 120 could also accommodate a relatively high input voltage received at the $V_{IN}$ package pin 104 with a differential amplifier design that has a relatively high impedance. The ADC 122 receives the analog signal output from the analog front end 120 and performs a delta-sigma modulation operation on the analog signal to generate a digital signal. In other implementations, the ADC 122 can perform other operations known in the art to accomplish an analog-to-digital conversion.

The second section 134 includes a DAC 126 and a filter 128. The DAC 126 receives the digital signal generated from ADC 122 and performs a demodulation operation to convert the digital signal back to an analog signal (e.g., an analog voltage signal). The filter 128 then filters out noise components of the analog signal caused from the modulation-demodulation operation. For example, the filter 128 can be a continuous-time filter that reduces the noise components, such as out-of-band thermal noise and quantization noise, provided to the $V_{OUT}$ package pin 118. The DAC 126 and filter 128 is able to perform demodulation operations and filter operations, respectively, that are known by persons ordinary in the art to generate an output signal at the $V_{OUT}$ package pin 118.

In one or more implementations, the packaged electronic device 102 generates one or more internal bandgap reference voltages from one or more bandgap reference voltage sources 138 and 140. For example, the packaged electronic device 102 can have one bandgap reference voltage source 140 within first section 132 and another bandgap reference voltage source 138 within second section 134. As shown in FIG. 1, the bandgap reference voltage source 140 does not directly connect to a package pin of the packaged electronic device 102. Each bandgap reference voltage source 140 and 138 includes a proportional to absolute temperature (PTAT) current generator and a complementary to absolute temperature (CTAT) voltage generator for generating an internal bandgap reference voltage that is temperature stable. The PTAT current generator generates a current with opposite slope with respect to temperature when compared to the CTAT voltage generator. Based on the opposite slopes, the resulting voltage from the PTAT current flowing through a resistor and the CTAT voltage generator becomes nearly independent of temperature.

As part of the packaging process, the different sections 132 and 134 may be trimmed to correct of a variety of parameters for the packaged electronic device 102, such as offset error, mismatches within the two sections 132 and 134, and voltage gain drift. Specific to correcting voltage gain drift, a manufacture can trim one or more components (e.g., resistor values) within the bandgap reference voltage sources that generate the internal bandgap reference voltages supplied to ADC 122 and DAC 126. As an example, equation 1 shown below represents the general relationship between the internal bandgap reference voltage, the PTAT current generator, and the CTAT current generator for a bandgap reference voltage source.

$$V_{bgp} = V_{CTAT} + V_{PTAT} \quad (1)$$

In equation 1 shown above, Vbgp represents the internal bandgap reference voltage; $V_{CTAT}$ represents the voltage associated with the CTAT current generator; and $V_{PTAT}$ represents the voltage associated with the PTAT current generator. To correct voltage gain drift and set the internal bandgap reference voltage to a target bandgap voltage, the manufacturer trims the $V_{PTAT}$ component (e.g., the resistance value) of the internal bandgap reference voltage Vbgp. In other implementations, the manufacturer trims the $V_{CTAT}$ component or both the $V_{PTAT}$ and $V_{CTAT}$ components to correct voltage gain drift and set the internal bandgap reference voltage to a target bandgap voltage. The manufacturer could also trim higher-order temperature coefficients to achieve better temperature stability.

In FIG. 1, prior to trimming the internal bandgap reference voltage to a target bandgap voltage, the ATE 130 is set up to perform testing operations to determine the internal bandgap reference voltage. Instead of having the ATE 130 directly sense and measure the internal bandgap reference voltage from the $V_{IN}$ package pin 104, the ATE 130 initially forces an external ground potential voltage (e.g., $V_{ATE}=0$ V) at the $V_{IN}$ package pin 104 to determine a zero detector output signal value $os_{ZERO}$. In other words, having the ATE 130 force an external zero potential voltage causes the analog front end 120 and ADC 122 to be a zero detector. The ATE 130 then saves the zero detector output signal value $os_{ZERO}$. Using FIG. 1 as an example, when ATE 130 forces a voltage of zero at the $V_{IN}$ package pin 104, the voltage output signal located at the $V_{OUT}$ package pin 118 could be about 1 mV. The ATE could then store the 1 mV output as the zero detector output signal value $os_{ZERO}$.

After determining the zero detector output signal $os_{ZERO}$, the ATE 130 adjusts the voltage at the $V_{IN}$ package pin 104 until the subsequent voltage output signal matches the saved, zero detector output signal value $os_{ZERO}$. When this occurs, the voltage set by ATE 130 referred to the external ground potential voltage could be positive or negative and equal to the internal bandgap reference voltage for the front section 132 with respect to the internal reference potential. Once determining the internal bandgap reference voltage, ATE 130 sets the input voltage at the same package pin to a target bandgap voltage. Within this disclosure, the target bandgap voltage refers to a reference voltage that is known to produce a relatively low or desired temperature coefficient for the packaged electronic device 102. Often times, device manufacturers and designers are able to identify the target bandgap voltage based on experimentally testing. The internal bandgap reference voltage is then trimmed such that the voltage output signal produced at a different package pin (e.g., $V_{OUT}$ package pin 118) is equal to the zero detector output signal value $os_{ZERO}$. The trimmed amount and/or generated trim code is based on the voltage set by ATE 130 to produce the subsequent voltage output signal that matches the saved, zero detector output signal value $os_{ZERO}$.

Measuring internal voltages (e.g., the internal bandgap reference voltage) by using the analog front end 120 and ADC 122 as a zero detector provides a variety of advantages. For instance, the disclosed measuring operations are able to accurately measure internal voltages without the use of additional testing equipment even when the analog front end 120 has a relatively high impedance. In contrast to other test configurations known in the art, a manufacturer would need to utilize components, such as high impedance resources or additional low-leakage buffers to ensure accuracy of the measured internal voltages. Additionally or alternatively, other testing configurations may require additional package pins or complex switches when testing the packaged electronic devices. For example, the packaged electronic device 102 includes complex circuits (e.g., switches) to be compliant with high clamping voltages of electrostatic discharge (ESD) protection structures and/or the ATE 130 would have to be able to perform relatively high temperature measurements. The disclosed measuring operations can also be used during package testing as opposed to wafer testing and does not require the ATE 130 to calibrate or quantify the gain of the analog front end 120 prior to measuring operations. Generally, the gain of the modulator 124 scales with a measured parameter, such as internal bandgap reference voltage. Using the analog front end 120 and ADC 122 as a zero detector negates concerns arising from gain scaling with the magnitude of the internal bandgap reference voltage.

Although FIG. 1 illustrates a specific implementation of a test system 100 that measures internal voltages of a packaged electronic device 102, the disclosure is not limited to the specific implementation illustrated in FIG. 1. For instance, even though FIG. 1 illustrates that the packaged electronic device 102 contains a signal chain that includes an analog front end 120, ADC 122, DAC 126 and filter 128, other implementations of the packaged electronic device 102 could implement different signal chains. As an example, rather the being an isolation amplifier, packaged electronic device 102 is an isolated or non-isolated integrated DSM that outputs a digital bitstream instead of an analog output voltage. Other implementations of test system 100 could test other packaged electronic devices 102 that have a different number of package pins. Additionally, even though the discussion of FIG. 1 revolves around measuring the internal bandgap reference voltages within packaged electronic device 102, other implementations could be setup to measure other types of internal voltages within packaged electronic device 102. The use and discussion of FIG. 1 is only an example to facilitate ease of description and explanation and the disclosure should not be limited to the specific implementation shown in FIG. 1.

Figure 2:
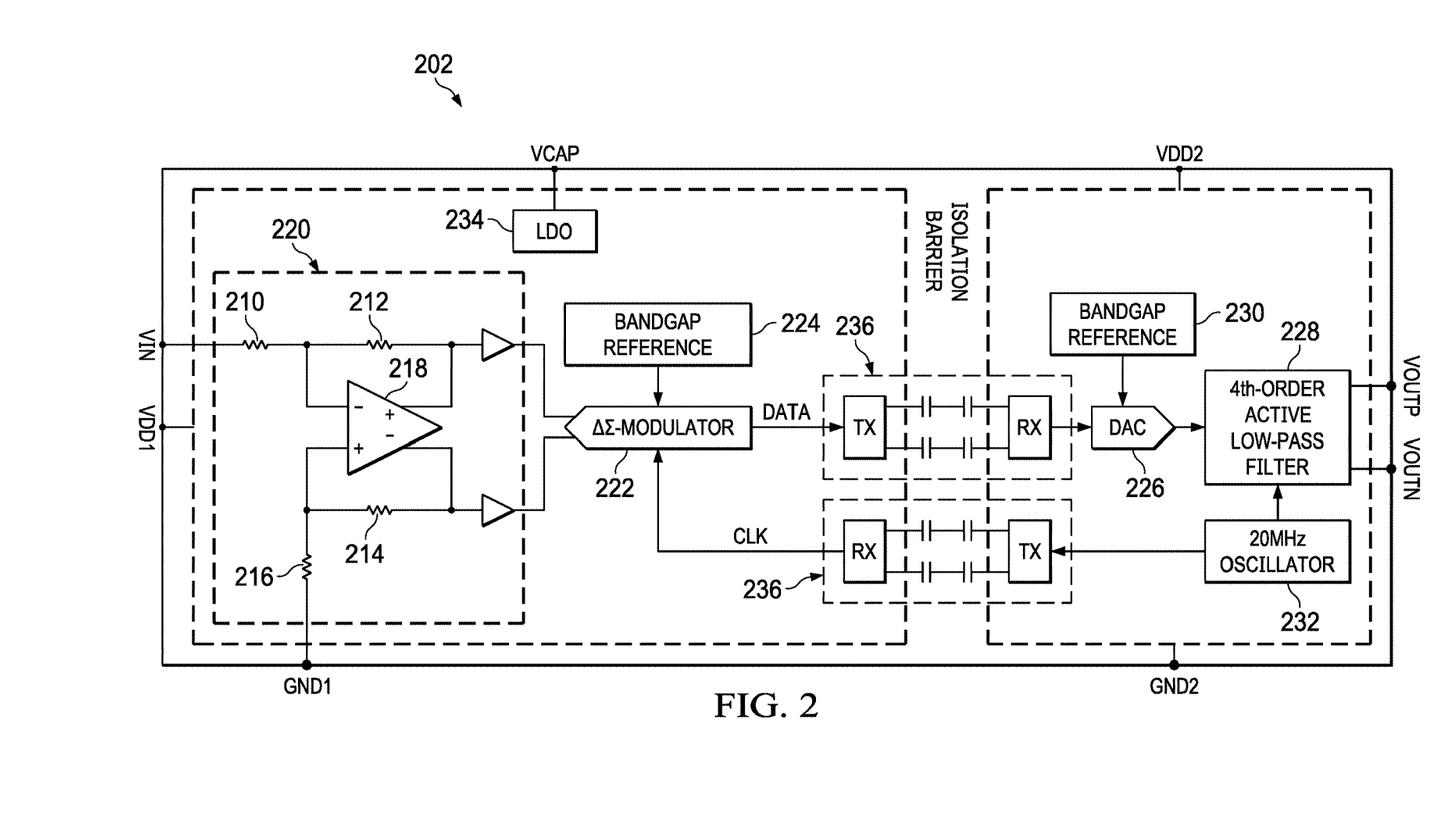
FIG. 2 is a schematic diagram of an isolation amplifier that can be utilized in a test system.

FIG. 2 is a schematic diagram of an isolation amplifier 202 that can be utilized in a test system 100 described in FIG. 1. Stated another way, isolation amplifier 202 is an example of the packaged electronic device 102 shown in FIG. 1. FIG. 2 illustrates that the isolation amplifier 202 produces a signal chain that includes an analog front end 220, a DSM 222, DAC 226, and a fourth-order active low-pass filter 228. The DSM 222 coverts analog signals to digital signals and the DAC 226 converts digital signals to analog signals. The DSM 222 and DAC 226 are separated from each other by isolation barrier 236. Because of the isolation, the DSM 222 receives an internal bandgap reference voltage from bandgap reference voltage source 224, and the DAC 226 receives a separate internal bandgap reference voltage from bandgap reference voltage source 230. FIG. 2 also illustrates that the isolation amplifier 202 includes other components known by persons of ordinary skill in the art, such as the low drop-out regulator 234 and oscillator 232 that are not directly related to measuring the internal bandgap reference voltage from bandgap reference voltage source 224.

Figure 3A:
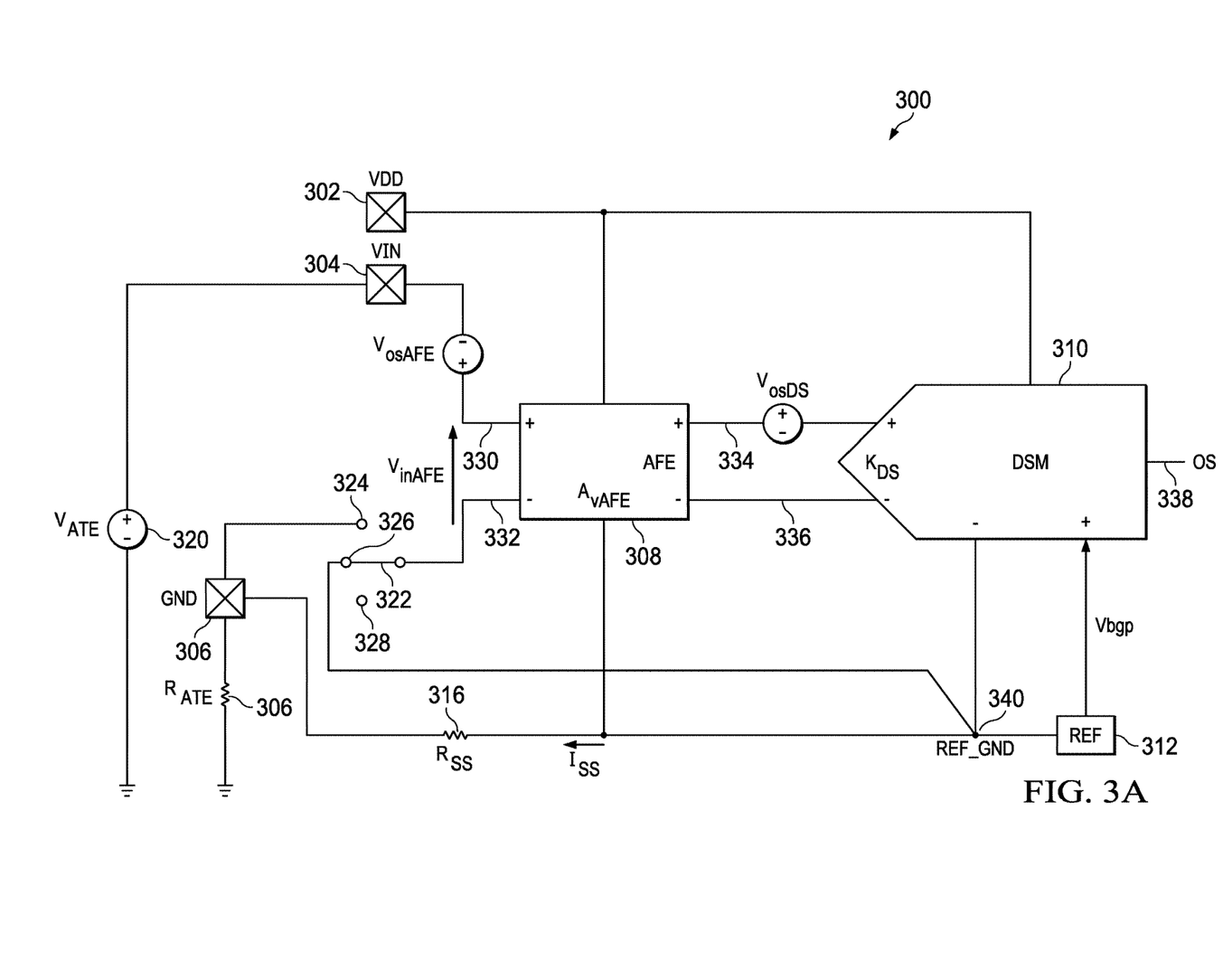
FIG. 3A is a schematic diagram of a test system for measuring internal bandgap reference voltage Vbgp for a packaged electronic device.
Figure 3B:
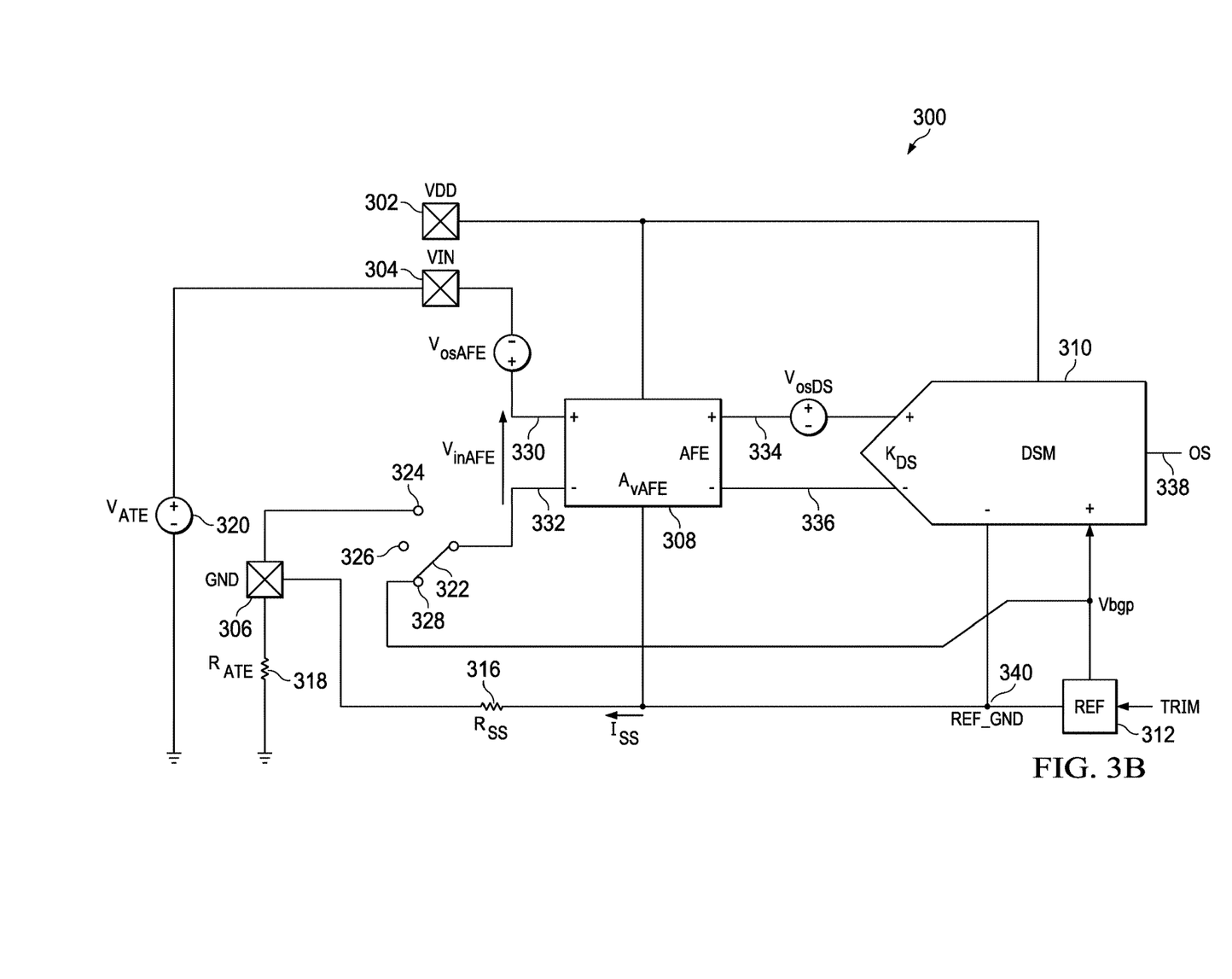
FIG. 3B is a schematic diagram of test system that utilizes the zero detector output bitstream value $os_{ZERO}$ to measure and/or trim the internal bandgap reference voltages.

FIG. 2 illustrates that the analog front end 220 includes resistors 210, 212, 214, and 216 and amplifier 218. In one or more implementations, the analog front end 220 has a relatively high impedance value based on resistors 210 and 216. For example, resistors 210 and 216 have a resistance value of about 1.2 MΩ and resistors 212 and 214 have a resistance value of about 100 kiloohm (kΩ). One reason the analog front end 202 has a relatively high impedance is because of the relatively high input voltage range (e.g., ±12 V) the $V_{IN}$ package pin could receive. The relatively high input voltage range is higher than the power supply voltage (e.g., VCAP voltage) for amplifier 218. Because of the relatively high impedance of the analog front end 220, rather than sensing the internal bandgap reference voltage that the bandgap reference voltage source 224 generates, an ATE can force external voltages on the $V_{IN}$ package pin of the isolation amplifier 202 and have the isolation amplifier's 202 signal chain compare the forced voltages with the internal bandgap reference voltage and trim the internal bandgap reference voltage accordingly. FIGS. 3A and 3B provide more detail regarding the disclosed measuring and trimming operations.

FIG. 3A is a schematic diagram of a test system 300 for measuring internal bandgap reference voltage Vbgp for a packaged electronic device. The test system 300 supplies a power supply voltage at the $V_{DD}$ package pin 302 and $V_{ATE}$ voltage from an ATE voltage source 320 at the $V_{IN}$ package pin 304. As shown in FIG. 3A, the $V_{DD}$ package pin 302 provides the power supply voltage to the analog front end 308 and DSM 310, and the $V_{IN}$ package pin 304 couples to a first input terminal 330 (e.g., non-inverting terminal) of the analog front end 308. A second input terminal 332 (e.g., inverting terminal) of the analog front end 308 connects to an internal switch 322 that is able to connect to different end nodes (e.g. three different end nodes 324, 326, and 328). The analog front end 308 receives an input voltage difference $V_{inAFE}$, which represents the differences between the two voltages at the first input terminal 330 and the second input terminal 332. The analog front end 308 produces a voltage gain $A_V$ of the voltage difference at the two input terminals 330 and 332 and produces two output voltages on a first output terminal 334 and a second output terminal 336.

The output terminals 334 and 336 are coupled to two different input terminals of the DSM 310. DSM 310 converts the analog voltage signals from the output terminals 334 and 336 to a digital signal. FIG. 3A illustrates that the DSM 310 is 1-bit DSM that outputs the digital signal as a digital bitstream on output terminal 338. The DSM 310 is also coupled to a bandgap reference voltage source 312 and a reference ground 340, which also connects to the bandgap reference voltage source 312. The bandgap reference voltage source 312 supplies an internal bandgap reference voltage Vbgp to the DSM 310 for converting the analog voltage signals to a digital bitstream.

Rather than test system 300 directly sensing and measuring the internal bandgap reference voltage Vbgp from the $V_{IN}$ package pin 304, the test system 300 initially sets the ATE voltage source 320 to an external ground potential voltage (e.g., $V_{ATE}$=0 V) at the $V_{IN}$ package pin 304. In FIG. 3A, internal switch 322 is set to connect to end node 326 in order to connect to reference ground 340. The test system 300 transmits a command to the packaged electronic device via a control package pin (e.g., a voltage output package pin) to change position of the internal switch 322. For example, the test system 300 transmits a command to have the internal switch 322 move and connect to end node 326 from end node 324. FIG. 3 illustrates that having internal switch 322 connect to end node 324 occurs when the testing system is not measuring and/or trimming the internal bandgap reference voltage Vbgp. In other words, when internal switch 322 connects to end node 324, the packaged electronic device is in normal operation.

After the internal switch moves to connect to end node 326, the analog front end 308 compares the external ground potential voltage that the ATE voltage source 320 supplies to $V_{IN}$ package pin 104 to reference ground 340 and amplifies the input voltage difference $V_{inAFE}$. The analog front end 308 outputs the amplified analog voltage signals to DSM 310. DSM 310 coverts the amplified analog voltage signals to a zero detector output digital bitstream at the output terminal 338. In FIG. 3A, the output signal (OS) at output terminal 338 represents the zero detector output digital bitstream. If the input voltage difference $V_{inAFE}$ is about zero (i.e., the voltages at the first input terminal 330 and 332 are the about same), then the zero detector output digital bitstream should have a bitstream density of 50%. The test system 300, or specifically, the ATE stores the zero detector output digital bitstream value $os_{ZERO}$ for later use. For example, the zero detector output digital bitstream value $os_{ZERO}$ could be an average value of the zero detector output digital bitstream. In FIG. 3, the zero detector output digital bitstream represents the zero detector output signal referenced in FIG. 1. Additionally, in one or more implementations, the output terminal 338 represents or is connected to a package pin (e.g., $V_{OUT}$ package pin 118 in FIG. 1) of a packaged electronic device.

Generally, test systems are normally susceptible to a variety of errors, such as gain compensation errors, voltage offset, and leakage current errors that prevent the zero detector output digital bitstream value $os_{ZERO}$ from producing a bitstream density of 50%. FIG. 3A provides examples of some of these errors that affect the zero detector output digital bitstream value $os_{ZERO}$. As an example, the analog front end 308 introduces a voltage offset $V_{osAFE}$ error, and DSM 310 introduces a voltage offset $V_{osDS}$ error. The reference ground could also experience a voltage offset based on ground current $I_{SS}$. As shown in FIG. 3A, based on the ground current $I_{SS}$, the reference ground is not at 0 V because of the voltage drops across resistor 316, which has a resistance value of $R_{SS}$, and resistor 318, which has a resistance value of $R_{ATE}$. By having the test system 300 save the zero detector output digital bitstream value $os_{ZERO}$ as a reference output, the test system 300 negates the influence of any gain and/or offset errors within the signal chain. Negating the error allows test system 300 to maintain accuracy and consistency in subsequent measurements operations.

For FIG. 3A, based on the test system errors, the differential input voltage and output voltage at the analog front end 308 are defined as shown in equations 2 and 3, and the resulting zero detector output bitstream value $os_{ZERO}$ is defined as shown in equation 4.

$$V_{inAFE}=V_{ATE}-I_{SS}*(R_{SS}+R_{ATE})=-I_{SS}*(R_{SS}+R_{ATE}) \quad (2)$$

$$V_{outAFE}=(V_{inAFE}+V_{osAFE})*A_{vAFE} \quad (3)$$

$$os_{ZERO}=(V_{outAFE}+V_{osDS})*K_{DS}/Vbgp \quad (4)$$

In equation 2 shown above, $V_{inAFE}$ represents the differences between the two voltages at the first input terminal 330 and the second input terminal 332; $V_{ATE}$ represents the voltage ATE voltage source 320 supplies; $I_{SS}$ represents the leakage current for reference ground 340 that flows through internal wiring of the of the packaged electronic device, the ground package pin 306, socket contact, and printed circuit board (PCB) trace of the test system; $R_{SS}$ represents the resistance value for reference ground's 340 internal wiring within the packaged electronic device; $R_{ATE}$ represents the resistance value of the printed circuit board (PCB) trace for test system 300. In equation 3, $V_{osAFE}$ represents an offset voltage the analog front end 308 introduces; $A_{vAFE}$ represents the voltage gain of the analog front end 308; and $V_{outAFE}$ represents the voltage output that the analog front end 308 supplies. In equation 4, $os_{ZERO}$ represents the stored value of the zero detector output bitstream at output terminal 338; $V_{osDS}$ represents an offset voltage the DSM 310 introduces; Vbgp represents the internal bandgap reference voltage; and $K_{DS}$ represents a scaling factor for DSM 310.

FIG. 3B is a schematic diagram of test system 300 that utilizes the zero detector output bitstream value $os_{ZERO}$ to measure and/or trim the internal bandgap reference voltages. FIG. 3B is similar to FIG. 3A except that the internal switch 322 is now set to connect to end node 328 in order to supply the internal bandgap reference voltage Vbgp to the second terminal 332. Recall that test system 300 is able to change the states of the internal switch 322 by sending one or more commands via a package pin. Once the internal switch is set to connect to end node 328, the test system 300 adjusts the ATE voltage source 320 to generate a voltage $V_{ATE}$ that causes the output digital bitstream (e.g., OS signal shown in FIG. 3B) at output terminal 338 to match the saved, zero detector output digital bitstream value $os_{ZERO}$. Matching the current output digital bitstream to the saved, zero detector output digital bitstream value $os_{ZERO}$ negates any gain error and/or voltage offsets that the analog front end 308 and DSM 310 introduces. When the output digital bitstream matches the saved, zero detector output digital bitstream value $os_{ZERO}$, voltage $V_{ATE}$ has been set to equal equation (5).

$$V_{ATE}=Vbgp-V_{REF\_GND} \quad (5)$$

In equation 5 shown above, $V_{ATE}$ represents the voltage ATE voltage source 320 supplies; Vbgp represents the internal bandgap reference voltage; and $V_{REF\_GND}$ represents the voltage at reference ground 340.

The test system 300 then uses the determined voltage $V_{ATE}$ to establish the trim amount and trim code to reach a target bandgap voltage. As previously discussed, the target bandgap voltage refers to a reference voltage that is known to produce a relatively low temperature coefficient for a packaged electronic device. As part of the trimming operation, test system 300 sets the ATE voltage source 320 to generate the target bandgap voltage (e.g., 1.200 V) and performs a trim of the bandgap reference voltage source 312. Once the test system 300 trims the bandgap reference voltage source 312, the test system 300 compares whether the output digital bitstream matches the saved, zero detector output digital bitstream value $os_{ZERO}$. If the output digital bitstream does not match the saved, zero detector output digital bitstream value $os_{ZERO}$, then test system 300 then re-adjusts the voltage $V_{ATE}$ until the output digital bitstream matches the saved, zero detector output digital bitstream value $os_{ZERO}$. Test system 300 then uses the determined voltage $V_{ATE}$ to establish another trim amount and trim code. Once the bandgap reference voltage source 312 generates a target bandgap voltage, then voltage difference $V_{inAFE}$ can be defined as shown in equation (6) below, where $V_{Target}$ represents the target bandgap voltage.

$$V_{inAFE}=V_{ATE}-Vbgp-I_{SS}*(R_{SS}+R_{ATE})=V_{Target}-Vbgp-I_{SS}*(R_{SS}+R_{ATE})=-I_{SS}*(R_{SS}+R_{ATE}) \quad (6)$$

Although FIGS. 3A and 3B illustrate specific implementations of a test system 300 that measures internal voltages of a packaged electronic device, the disclosure is not limited to the specific implementation illustrated in FIGS. 3A and 3B. For instance, FIGS. 3A and 3B illustrate operations to measure and trim voltage for the bandgap reference voltage source; however, other implementations could measure and trim other internal voltages that are not directly connected to package pins of the packaged electronic device. Also, even though FIGS. 3A and 3B illustrate that internal switch 322 is coupled to the inverting terminal of the analog front end 308 and the $V_{IN}$ package pin 304 is coupled to the non-inverting terminal of the analog front end 308, other implementations could reverse polarities such that the inverting terminal of the analog front end 308 couples to the $V_{IN}$ package pin 304 and the non-inverting terminal of the analog front end 308 couples to the internal switch 322. Additionally, the internal switch 322 is not a single internal switch, but rather a plurality of internal switches. FIGS. 3A and 3B also illustrate that DSM 310 is a 1-bit DSM; however, other implementations could utilize other types of DSM or analog-to-digital converters. The use and discussion of FIGS. 3A and 3B are only an example to facilitate ease of description and explanation.

Figure 4:
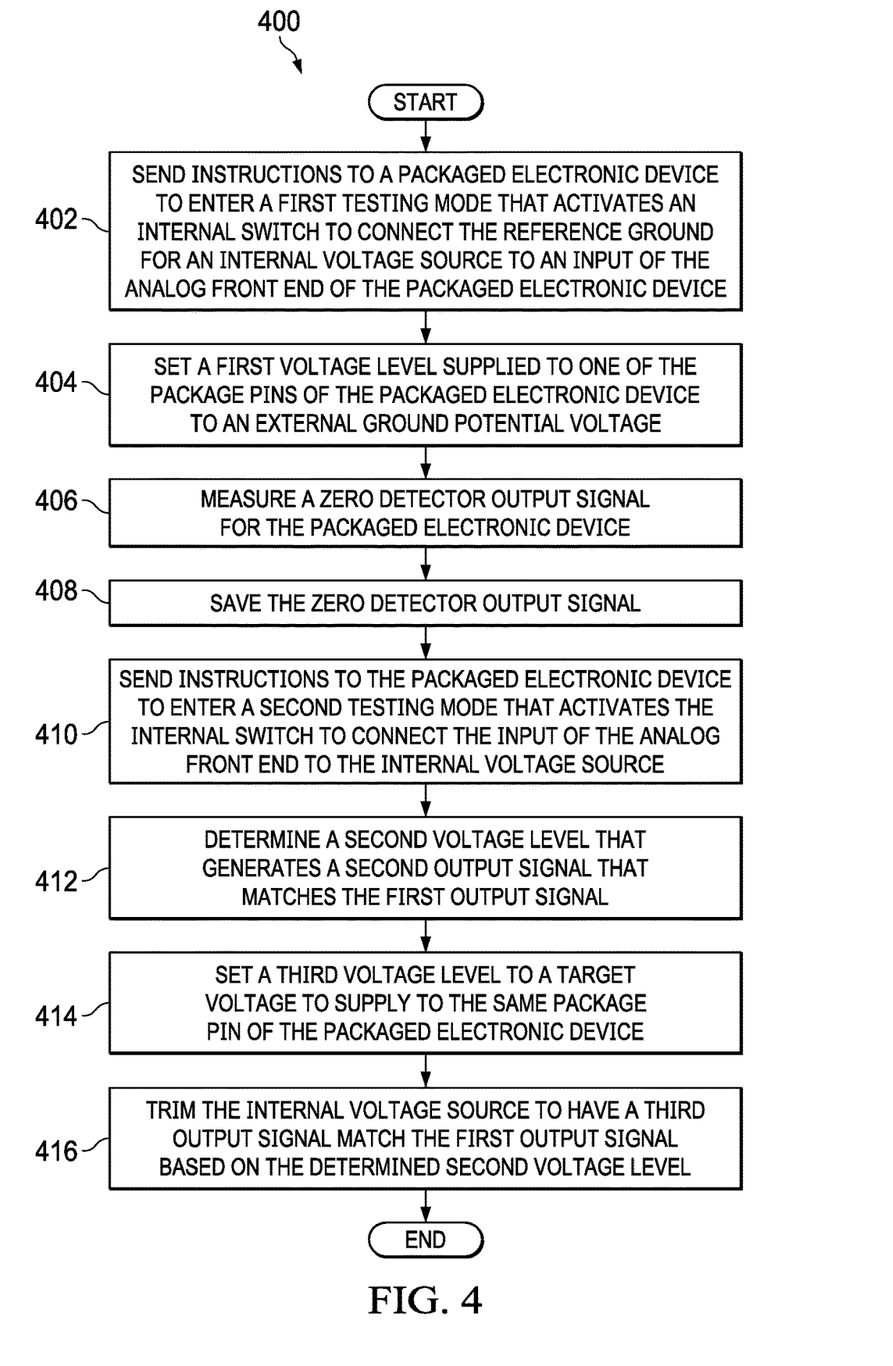
FIG. 4 is a flow chart of a method to measure internal voltages within a packaged electronic device.

FIG. 4 is a flow chart of a method 400 to measure internal voltages (e.g., internal bandgap reference voltages) within a packaged electronic device. Using FIGS. 1 and 3A as examples, method 400 can be implemented within the test system 100 and 300, respectively. In particular, method 400 utilizes a test system to adjust and set varying voltage levels at one or more package pins and/or set different testing mode for the packaged electronic device. The internal voltage that method 400 measures are not directly connected to package pins of the packaged electronic device. Although FIG. 4 illustrates that the blocks of method 400 are implemented in a sequential operation, method 400 is not limited to this order of operations, and instead other implementations of method 400 may have one or more blocks implemented in parallel operations. For example, blocks 414 and 416 can be implemented sequentially or in parallel. In other implementations, method 400 may skip block 412 to improve testing efficiency.

Method 400 starts at block 402 and sends instructions to a packaged electronic device to enter a first testing mode that activates an internal switch to connect the reference ground of an internal voltage source (e.g., bandgap reference voltage source) to an input of the analog front end of the packaged electronic device. Using FIG. 3A as an example, the first testing mode has internal switch 322 connected to end node 326. Afterwards, method 400 moves to block 404 to set a first voltage level supplied to one of the package pins of the packaged electronic device to an external ground potential voltage (e.g., 0 V). Stated another way, the first voltage level acts an external zero potential voltage level. With reference to FIG. 3A, the first voltage level is the $V_{ATE}$ voltage that the ATE voltage source supplies. Method 400 then proceeds to block 406 and measures a zero detector output signal for the packaged electronic device. In one implementation, the zero detector output signal is an analog voltage, and in other implementations, the zero detector output signal is a digital bitstream. The type of output signal is dependent on the signal chain of the packaged electronic device and the type of internal voltage source (e.g., bandgap reference voltage source).

Method 400 continues to block 408 and saves the zero detector output signal for future use. As previously discussed, the zero detector output signal captures any offset and/or other errors inherent within the signal chain of the packaged electronic device. By using the first output signal as reference, method 400 is able to negate these offsets and other errors and prevent them from affecting the accuracy of measuring internal voltages. Method 400 then moves to block 410 and sends instructions to the packaged electronic device to enter a second testing mode that activates the internal switch to connect to the internal voltage source. Method 400 may then continue to block 412 to determine a second voltage level that generates a second output signal that matches the first output signal. Using FIG. 3B as an example, method 400 initially sets the $V_{ATE}$ voltage to a given value, and continue to adjust the $V_{ATE}$ voltage until the second output signal that matches the first output signal. In one or more implementations, method 400 skips block 412 and directly moves to block 414.

Method 400 then proceeds to block 414 to set third voltage level to a target voltage to supply to the same package pin of the packaged electronic device. For example, when trimming the internal bandgap reference voltage, method 400 sets the third voltage level to a target bandgap voltage that generates a relatively temperature coefficient for the packaged electronic device. Method 400 then moves to block 416 and trims the internal voltage source to have a third output signal match the first output signal based on the determined second voltage level. As an example, method 400 utilizes the second voltage level to determine the amount of trim or the trim code used for correcting the internal bandgap reference voltage to the target voltage. Using FIG. 1 as an example, to trim the bandgap reference voltage source, method 400 has the ATE 130 send trim instructions to the packaged electronic device 102. The trim instructions could include the amount of trim or the trim code to correct the internal bandgap reference voltage. The packaged electronic device 102 can then use the trim instructions to trim the bandgap reference voltage. If method 400 determines that the third output signal fails to match the first output signal, method 400 is able to repeat blocks 412, 414, and 416 until the third output signal matches the first output signal.

Figure 5:
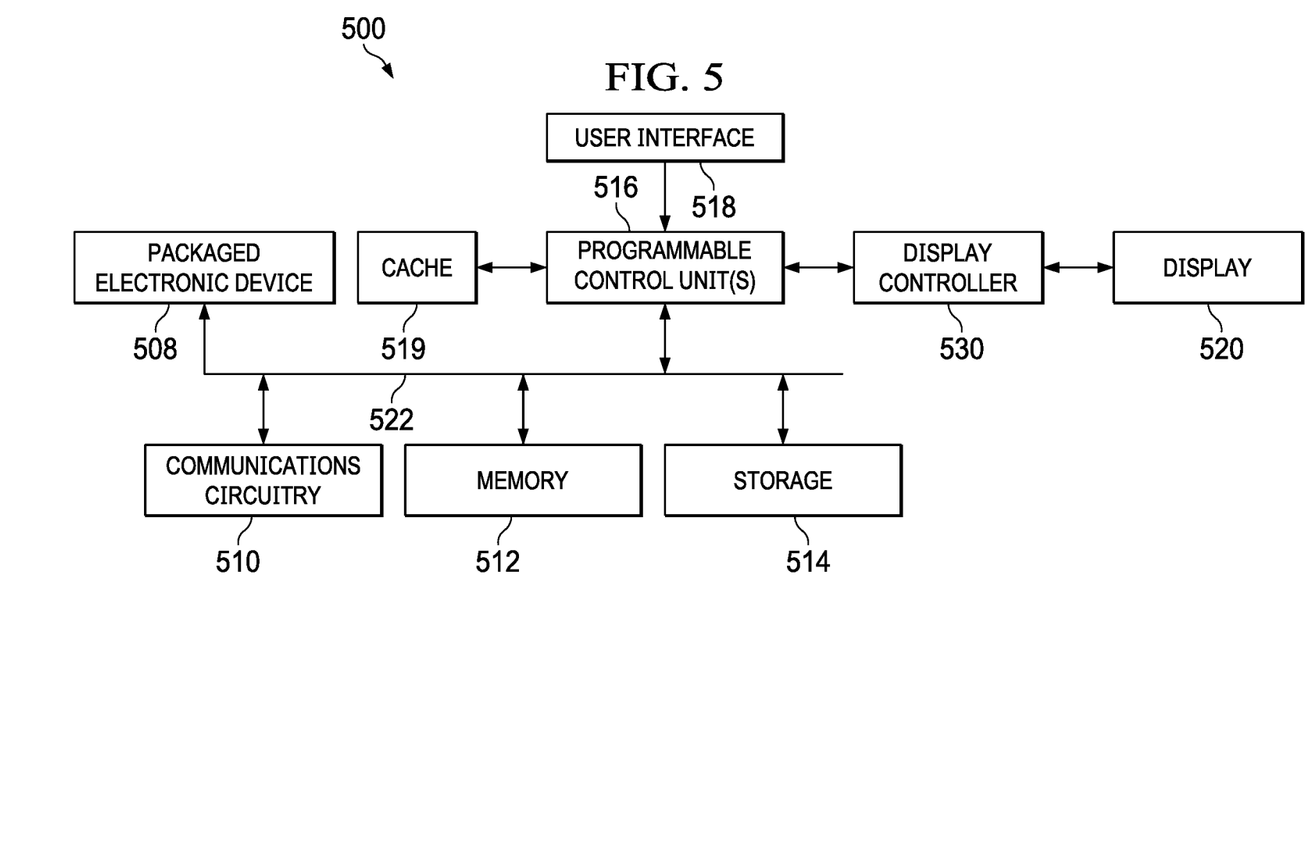
FIG. 5 shows one example of a test system that can be used to implement the techniques disclosed herein.

FIG. 5 shows one example of a test system 500 that can be used to implement the techniques disclosed herein. While FIG. 5 illustrates various components of a computer system, it is not intended to represent any particular architecture or manner of interconnecting the components as such details are not germane to the present disclosure. As shown in FIG. 5, the test system 500, which is a form of a data processing system, includes an interconnect 522 that is coupled to one or more programmable control units 516, a packaged electronic device 508, memory 512, which may include one or both of a volatile read/write random access memory (RAM) and a read-only memory (ROM), and a non-volatile storage device 514. In one or more implementations, memory 512 and storage device 514 are tangible, non-transitory memories that store executable code and instructions. The test system 500 utilizes the programmable control units 516, memory 512 and/or storage device 514 to measure internal voltages from the packaged electronic device 508. As an example, memory 512 and/or storage device 514 could include a packaged electronic device test application that the programmable control units 516 execute to measure internal voltages.

The programmable control units 516 can be one or more central processing units (CPUs) and/or graphics processing units (GPUs). For purposes of this disclosures, programmable control units can also be referred to and interchanged with the term "processor." Various implementations of the 516 also include one or more local memories, not shown for clarity. The programmable control unit(s) 516 retrieve instructions from the memory 512 and the storage device 514 and execute the instructions using cache 518 to perform operations described below. The interconnect 522 interconnects these various components together and also interconnects these components 516, 512, and 514 to a display controller 530 and display device 520. Where volatile RAM is included in memory 512, the RAM is typically implemented as dynamic RAM (DRAM) which requires power continually in order to refresh or maintain the data in the memory. The display controller 530 and display device 520 optionally include one or more GPUs to process display data.

The storage device 514 is typically a magnetic hard drive, an optical drive, a non-volatile solid-state memory device, or other types of memory systems which maintain data (e.g. large amounts of data) even after power is removed from the system. While FIG. 5 shows that the storage device 514 is a local device coupled directly to the rest of the components in the data processing system, implementations can utilize a non-volatile memory which is remote from the system, such as a network storage device which is coupled to the data processing system through a communications circuitry 510 that provides a network interface and other communication functionality, including a wired or wireless networking interface. The interconnect 522 includes one or more interconnects connected to each other through various bridges, controllers and/or adapters as is well known in the art. Although only a single element of each type is illustrated in FIG. 5 for clarity, multiple elements of any or all of the various element types may be used as desired.

At least one implementation is disclosed and variations, combinations, and/or modifications of the implementation(s) and/or features of the implementation(s) made by a person having ordinary skill in the art are within the scope of the disclosure. Alternative implementations that result from combining, integrating, and/or omitting features of the implementation(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

While several implementations have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various implementations as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. A packaged electronic device having:
an internal switch and a first package pin;
an analog front end coupled to the internal switch and the first package pin;
an internal voltage source that is not directly connected to any package pin of the package electronic device; and
a second package pin that produces an output signal based on an input voltage of the analog front end,
wherein the packaged electronic device is configured to:
receive an instruction to activate the internal switch to connect to a reference ground of the internal voltage source to a first input of the analog front end;
receive an external ground potential voltage at the first package pin of the packaged electronic device;
generate a zero detector output signal for the packaged electronic device at the second package pin;
receive a second instruction to activate the internal switch to connect the first input of the analog front end to the internal voltage source;
receive a second voltage level at the first package pin that generates a second output signal at the second package pin that matches the zero detector output signal, wherein the second voltage level differs from the external ground potential voltage; and
receive trim instructions to trim an internal voltage generated by the internal voltage source to a voltage level that is closer to a target voltage level.

2. The packaged electronic device of claim 1, wherein the packaged electronic device further comprises a delta sigma modulator that is coupled to the analog front end, the internal voltage source, and the second package pin.

3. The packaged electronic device of claim 1, wherein the packaged electronic device is further configured to:
receive a third voltage level at the target voltage level at the first package pin to generate a third output signal;
compare the third output signal to the zero detector output signal; and
receive trim instructions to trim the internal voltage when the third output signal differs from the zero detector output signal.

4. The packaged electronic device of claim 1, wherein the zero detector output signal is a digital signal.

5. The packaged electronic device of claim 1, wherein the zero detector output signal is an analog voltage.

6. The packaged electronic device of claim 1, wherein the packaged electronic device is an isolation amplifier.

7. The packaged electronic device of claim 1, wherein the internal voltage source is a bandgap reference voltage source.

8. The packaged electronic device of claim 1, wherein the first package pin couples to a second input of the analog front end.

9. A non-transitory memory on which instructions are stored, comprising instructions that when executed cause a processor to:
generate an instruction to send to a packaged electronic device to activate an internal switch to connect a reference ground of an internal voltage source to a first input of an analog front end of the packaged electronic device;
supply an external ground potential voltage to a first package pin of the packaged electronic device;
measure a zero detector output signal for the packaged electronic device from a second package pin;

generate a second instruction to send to the packaged electronic device to activate the internal switch to connect the first input of the analog front end to the internal voltage source;

supply a second voltage level to the first package pin that generates a second output signal that matches the zero detector output signal, wherein the second voltage level is differs from the external ground potential voltage; and determine, based on the second voltage level, a trim amount for an internal voltage generated by the internal voltage source to be closer to a target voltage level.

10. The non-transitory memory of claim 9, wherein the instructions further comprise instructions that when executed cause the processor to:

supply a third voltage level at the target voltage level at the first package pin to generate a third output signal;

compare the third output signal to the zero detector output signal; and determine, based on comparing the third output signal, the trim amount for the internal voltage when the third output signal does not match the zero detector output signal.

11. The non-transitory memory of claim 9, wherein the zero detector output signal is an analog voltage.

12. The non-transitory memory of claim 9, wherein the zero detector output signal is a digital signal.

13. The non-transitory memory of claim 9, wherein the first package pin is an input voltage package pin.

14. The non-transitory memory of claim 9, wherein the packaged electronic device is an isolation amplifier or a delta sigma modulator.

15. The non-transitory memory of claim 9, wherein the first package pin couples to a second input of the analog front end.

16. The non-transitory memory of claim 9, wherein the internal voltage source is a bandgap reference voltage source that supplies the internal voltage to a modulator of the packaged electronic device.

17. A method comprising:

receiving an instruction to activate an internal switch within a packaged electronic device to connect to a reference ground of an internal voltage source to a first input of an analog front end;

receiving an external ground potential voltage at a first package pin of the packaged electronic device;

generating a zero detector output signal for the packaged electronic device at a second package pin;

receiving a second instruction to activate the internal switch to connect the first input of the analog front end to the internal voltage source;

receiving a second voltage level at the first package pin that generates a second output signal that matches the zero detector output signal, wherein the second voltage level is greater or less than the external ground potential voltage;

receiving trim instructions to trim an internal voltage generated by the internal voltage source to a voltage level that is closer to a target voltage level; and trimming the internal voltage based on the trim instructions.

18. The method of claim 17, further comprising:

receiving a third voltage level at the target voltage level at the first package pin to generate a third output signal;

comparing the third output signal to the zero detector output signal; and receiving trim instructions to trim the internal voltage when the third output signal does not match the zero detector output signal.

19. The method of claim 17, wherein the zero detector output signal is either an analog voltage or a digital signal.

20. The method of claim 17, wherein the internal voltage source is a bandgap reference voltage source that supplies the internal voltage to a modulator of the packaged electronic device.

* * * * *